United States Patent
Kellerman et al.

(10) Patent No.: US 6,735,378 B1
(45) Date of Patent: May 11, 2004

(54) PRESSURE CONTROLLED HEAT SOURCE AND METHOD FOR USING SUCH FOR RTP

(75) Inventors: Peter L. Kellerman, Essex, MA (US); Frederick M. Carlson, Potsdam, NY (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/448,156

(22) Filed: May 29, 2003

(51) Int. Cl.[7] .............................................. F26B 19/00
(52) U.S. Cl. ................... 392/416; 392/407; 392/418; 219/390; 219/405; 219/411; 118/724; 118/725; 118/50.1
(58) Field of Search ................ 219/390, 405, 219/411; 392/416, 418, 407; 118/724, 725, 50.1

(56) References Cited

U.S. PATENT DOCUMENTS

| | | |
|---|---|---|
| 4,854,263 A | 8/1989 | Chang et al. |
| 4,914,276 A * | 4/1990 | Blair ........................ 219/390 |
| 5,990,453 A * | 11/1999 | Das et al. .................... 219/405 |
| 5,991,508 A * | 11/1999 | Ohmine et al. ............. 392/418 |
| 6,172,337 B1 | 1/2001 | Johnsgard et al. |
| 6,183,565 B1 | 2/2001 | Granneman et al. |
| 6,215,106 B1 | 4/2001 | Boas et al. |
| 6,342,691 B1 | 1/2002 | Johnsgard et al. |
| 6,355,909 B1 * | 3/2002 | Griffiths et al. ............. 219/403 |
| 6,359,263 B2 * | 3/2002 | Tay et al. .................... 219/411 |

* cited by examiner

*Primary Examiner*—Shawntina Fuqua
(74) *Attorney, Agent, or Firm*—Eschweiler & Associates, LLC

(57) ABSTRACT

A thermal device with a container having a surface exposed to the substrate, wherein the container further has a heat source and a plurality of thermal shields situated between the surface exposed to the substrate and the heat source. The thermal shields are spaced from one another by a predetermined distance defining one or more gaps therebetween, wherein the predetermined distance is associated with a mean free path of a gas residing therein. Alternatively, the predetermined distance is variable. A pressure of a gas residing within the one or more gaps is controlled, wherein the pressure of the gas switches the thermal conductivity of the gas between generally conductive and generally nonconductive.

50 Claims, 7 Drawing Sheets

PRESSURE CONTROLLED HEAT SOURCE AND METHOD FOR USING SUCH FOR RTP

FIELD OF THE INVENTION

The present invention relates generally to semiconductor thermal processing systems, and more specifically to a device and method for rapidly thermally processing a substrate.

BACKGROUND OF THE INVENTION

Thermal processing of silicon substrates or wafers is important for manufacturing modern microelectronics devices. Such processes, including silicide formation, implant anneals, oxidation, diffusion drive-in and chemical vapor deposition (CVD), may be performed using conventional low temperature thermal processing techniques. In contrast, some dopant activation processes are performed at substantially higher temperatures for relatively short durations of time. Furthermore, many microelectronics circuits require feature sizes smaller than one micron and junction depths less than a few hundred angstroms. In order to limit both the lateral and downward diffusion of dopants, as well as to provide a greater degree of control during processing, it is desirable to minimize the duration of high temperature processing.

One approach for minimizing processing time utilizes a heat treatment apparatus such as a rapid thermal processing (RTP) system. Rapid thermal processing of semiconductor wafers provides a technique for fabrication of verylarge-scale-integrated (VLSI) and ultra-large-scale-integrated (ULSI) electronic devices. There are several challenges, however, to meeting the thermal requirements of rapid thermal processing. For example, fast rates of change of wafer temperature are typically desired, as well as temperature uniformity across the wafer during the temperature changes.

One significant performance limitation of conventional RTP systems (e.g., in terms of "thermal budget", or the time the wafer spends above about 950C) is rapidly switching between heating the wafer and cooling the wafer. Current RTP systems typically have a heat source that comprises either heat lamps or resistive elements for heating the wafer. Heat lamps have the benefit that the lamps can be quickly switched on and off, however, the thermal profile across the surface of the wafer can vary significantly. Resistive elements, on the other hand, can provide more uniformity in the thermal profile across the surface of the wafer, however, the resistive elements cannot typically be switched on and off rapidly. Thus, resistive element type systems may require a mechanical shield to be placed between the wafer and the heater after heating is complete, and/or necessitate a movement of the wafer to or from the proximity of the heater.

In addition, rapid thermal annealing (RTA, also called "spike annealing") requires the switching between heating and cooling to occur very quickly once the spike temperature is reached. Spike annealing of a semiconductor wafer typically comprises inserting the wafer into a thermal processing system, rapidly heating the wafer to a high temperature, and then quickly cooling the wafer back down to room temperature.

According to current technological requirements, an ideal heat source should be capable of rapidly increasing a temperature of the wafer to a maximum temperature of 1050C, and then to cease adding energy to the system, whereby the wafer could be rapidly cooled. Accordingly, temperature ramp rates in excess of 250 C/s are desirable, and present RTP industry forecasts call for rates as high as 500 C/s in the near future. Typical lamp-based RTP systems rely primarily on radiative heat transfer. Typical lamp-based systems generally suffer from both temperature profile uniformity issues due to their numerous lamps across a surface of the wafer, as well as wafer pattern effects due to the radiative nature of the heat transfer. The patterning effects are typically caused by varying emissivities across the surface of the wafer, wherein patterned polysilicon, nitride, and oxide, for example, absorb the radiative heat at different rates, thus producing micro-scale temperature gradients on the device level.

FIG. 1 illustrates a typical resistive heating enclosure 10, wherein some of the issues related to the patterning effects seen in a typical lamp-based system are resolved by heating the substrate 15 using a heated block 20. The enclosure 10 typically comprises a resistive heater 25 configured to heat the heated block via conduction, wherein the heated block attains a generally uniform thermal profile at a surface 30 associated with the substrate 15. The substrate 15 resides on a lift mechanism 35 (typically comprising a plurality of pins 40), wherein the lift mechanism is operable to translate the substrate between a heating position 45 proximate to the heated block 20 and a loading position 50. The substrate 15 is generally radiatively heated by radiative heat transfer from the heated block 20, as well as by conductive or convective heat transfer through a gas (not shown) residing within the enclosure 10.

The prior art heating enclosure 10, however, suffers several difficulties when attempting to attain the fast temperature ramp rates required in RTA processes. For example, the heated block 20 continues to transfer radiative thermal energy to the substrate 15, even when the substrate is in the loading position 50. Typically, this necessitates the loading position 50 to be a great distance away from the heated block 20 in order to aver the effects of the radiation. Such an arrangement is not optimal, however, since translation time between the heating position 45 and the loading position 50 must be accounted for in terms of thermal budget. Alternatively, a shield may be placed between the substrate 15 and the heated block 20 when such radiation is not desired. This solution, again, is not optimal, since it incorporates adding another moving part within the enclosure 10 that may create contamination issues. Furthermore, wafer insertion into the thermal processing system can pose other problems, including non-uniform heating of the wafer due to the time needed for placement of the wafer. Non-uniform heating of the wafer can lead to severe mechanical stress in the substrate, thus negatively impacting yield or even rendering the wafer useless.

Therefore, a need exists in the art for a heat source that can be readily switched between a low temperature for wafer insertion and removal and a high temperature for rapid heating of the wafer, while also providing temperature uniformity across the wafer.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its purpose is to present some concepts of the invention in a simplified form as a prelude to the more detailed description that is presented later.

The present invention is directed to a thermal device for processing a substrate, as well as a method for thermally processing a substrate. The thermal device is operable to provide a rapid and uniform temperature change to efficiently heat a substrate, thereby improving process control. According to one aspect of the present invention, a container is disclosed comprising a heat source and a plurality of thermal shields. The plurality of thermal shields, for example, are spaced from one another by a predetermined distance, defining one or more gaps therebetween. The predetermined distance is furthermore associated with a mean free path of a gas residing within the one or more gaps.

In accordance with one aspect of the present invention, the predetermined distance that separates the plurality of thermal shields, for example, is sized such that thermal conduction between the plurality of thermal shields via the gas is generally permitted in the free molecular regime. In one example, the plurality of thermal shields comprise one or more perforations therethrough, wherein the one or more perforations are operable to allow a flow of the gas freely therethrough. The perforations, for example, are substantially larger than the predetermined distance, wherein the perforations generally permit the gas to flow in a viscous regime, thereby facilitating an expedient flow of gas within the one or more gaps. The gas, for example, is introduced into the one or more gaps from a gas source, or from a source such as from within a process chamber atmosphere.

According to another exemplary aspect of the present invention, the plurality of thermal shields are generally corrugated, wherein the predetermined distance is selectively variable. In one example, the predetermined distance is selectively variable based on a pressure differential between an interior portion of the container and an external environment. The pressure differential is operable to generally compress or expand the plurality of thermal shields with respect to one another, thereby respectively decreasing or increasing the predetermined distance associated with the one or more gaps. Increasing the predetermined distance generally facilitates thermal conduction through the gas in the viscous regime, while decreasing the predetermined distance generally limits thermal conduction through the gas in the viscous regime.

According to another exemplary aspect of the present invention, a method for thermally processing a substrate in a thermal device is disclosed, wherein the thermal processing system comprises a container further comprising a heat source and a plurality of thermal shields. The method comprises initiating a gas at a first pressure within the one or more gaps defined by a predetermined distance between the plurality of thermal shields, wherein a gas residing within the one or more gaps is generally non-conductive. A substrate is placed in the thermal device and a heating position is initiated, wherein the substrate is in close proximity to a surface of the container. The gas is introduced into the one or more gaps at a second pressure, wherein thermal conduction is generally permitted between the plurality of thermal shields, and wherein the substrate is exposed to thermal radiation and thermal conduction in the free molecular regime from the heat source. Alternatively, when the gas is introduced at the second pressure, the predetermined distance increases, wherein the substrate is exposed to thermal radiation and conduction in the viscous regime. The first pressure is again initiated, wherein the thermal conduction is essentially halted, and the substrate is removed from the thermal device.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
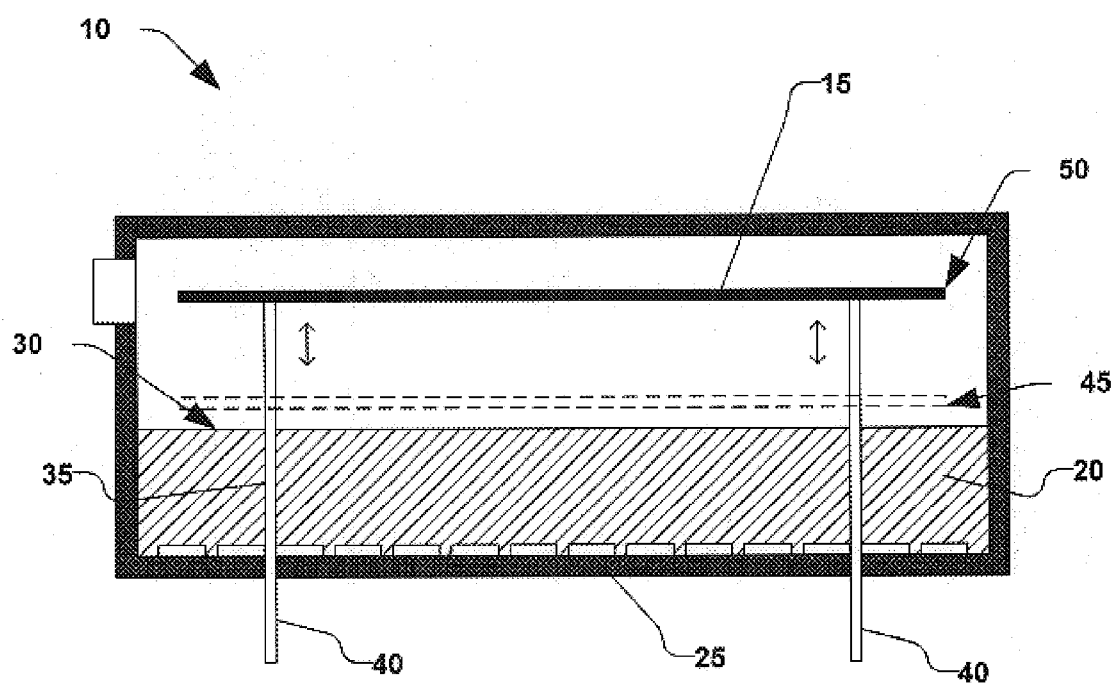
FIG. 1 illustrates a heating enclosure of the prior art.

The present invention is directed towards a thermal device and an associated system and method that incorporate several inventive features that improve a rapid thermal processing (RTP) system, reduce variations in a thermal profile associated with the RTP system, and improve process control therein. Accordingly, the present invention will now be described with reference to the drawings, wherein like reference numerals are used to refer to like elements throughout. It should be understood that the description of these aspects are merely illustrative and that they should not be taken in a limiting sense. In the following description, for purposes of explanation, numerous specific details are set forth in order to provide a thorough understanding of the present invention. It will be evident to one skilled in the art, however, that the present invention may be practiced without these specific details.

Figure 2:
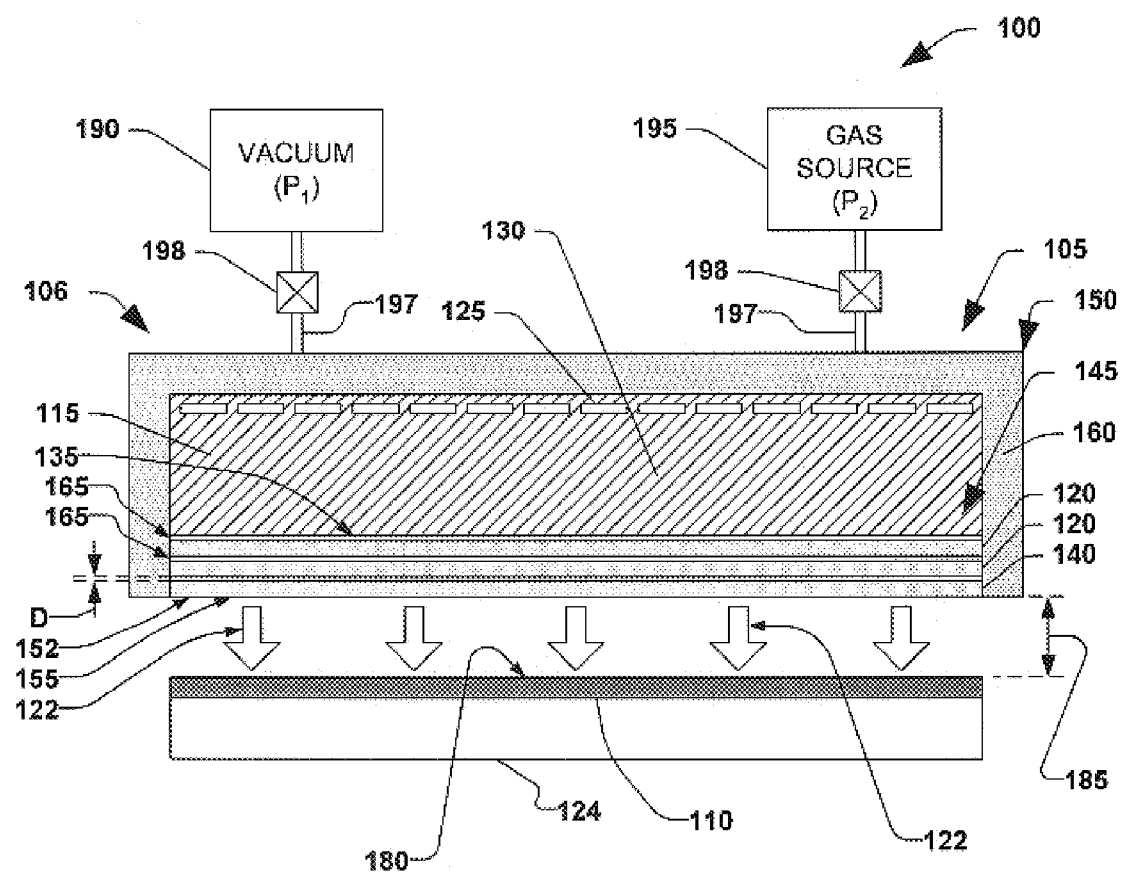
FIG. 2 is a cross-sectional view illustrating an exemplary thermal processing system in the molecular regime according to one exemplary aspect of the present invention.

The present invention overcomes challenges of the prior art by providing a pressure controlled thermal device and an associated method for selectively heating a substrate, wherein the thermal device is operable to quickly switch between a heating mode and a non-heating mode, and wherein the transfer of thermal energy across the substrate is significantly uniform. FIG. 2 illustrates an exemplary pressure controlled thermal device 100 according to one exemplary aspect of the present invention. The thermal device 100 comprises a container 105, wherein the container further defines a pressure controlled heat source 106 for thermally processing a substrate 110. The container 105, for example, comprises a heat source 115 and a plurality of thermal shields 120, wherein the heat source 115 is operable to provide Joule heating 122 (e.g., thermal energy) to the substrate 110 residing on a substrate holder 124. According to one exemplary aspect of the invention, the heat source 115 comprises an electrical resistance heater 125 embedded within a thermal block 130. The thermal block 130, for example, is comprised of a high diffusivity material (e.g., tungsten, graphite, or SiC), wherein thermal energy from the electrical resistance heater 125 is uniformly distributed across a surface 135 of the heat source 115.

According to another exemplary aspect of the invention, a total heat capacity (HC) of the heat source 115, while still many times a heat capacity of the substrate 110, is preferably kept small (e.g., about 10 times the HC of the substrate), wherein the heat source is operable to quickly approach an isothermal state. The HC of the heat source 115, for example, is generally determined in terms of a product of a total mass ($m_{heat\ source}$) of the heat source and a specific heat ($C_{pheat\ source}$) associated with the heat source. One advantage to providing a heat source 115 having a small HC is that the small HC heat source generally permits a temperature of the heat source to be readily modified in accordance with process requirements (e.g., a fast switching time). Alternatively, the HC of the heat source 115 can be moderately high, wherein switching time is generally on the order of minutes, rather than milliseconds. The thermal block 130, for example, may further comprise an anisotropic material that generally limits a flow of thermal energy 122 in one direction (e.g., horizontally) in order to maximize directionality of heat flow in another direction (e.g., vertically).

The container 105, for example, further comprises a sealing plate 140, wherein the sealing plate is operable to generally isolate an inner portion 145 of the container 105 from an external environment 150. A surface 152 of the sealing plate 140 generally defines a surface 155 of the container 105 exposed to the substrate 110. The sealing plate 140, for example, is comprised of a low emissivity material such as silicon nitride ($Si_3N_4$) or molybdenum (Mo). Preferably, the sealing plate further has a low HC (i.e., the product of a mass of the sealing plate times a specific heat of the sealing plate ($m_{sealing\ plate} \times C_{psealing\ plate}$)) to allow for a fast temperature response. The surface 152 of the sealing plate 140, for example, is coated with a material such as SiC, wherein the material is compatible with wafer processing (e.g., does not promote contamination).

The container 105 is furthermore operable to generally direct thermal energy 122 from the heat source 115 toward the substrate 110, while generally limiting thermal loss to the external environment 150. The container 105, for example, further comprises one or more layers of insulation 160, wherein the one or more layers of insulation generally limits heat loss from the container 105. The one or more layers of insulation 160 may comprise, for example, zirconia felt manufactured by Zircar Zirconia, Inc.

According to another exemplary aspect of the present invention, thermal energy 122 from the heat source 115 is directed generally towards the surface 155 of the container 105 through the plurality of thermal shields 120. The plurality of thermal shields 120, for example, are comprised of a low emissivity material, such as silicon nitride ($Si_3N_4$) or molybdenum (Mo). Alternatively, the plurality of thermal shields 120 are comprised of one or more higher emissivity materials, wherein the one or more higher emissivity materials are operable to further adjust an operating range associated with the device 100. Preferably in the present example, the plurality of thermal shields 120 are closely packed atop one another, wherein movement of the plurality of the thermal shields with respect to one another is generally limited. The number of thermal shields 120 and the emissivity thereof can be tailored to meet specific process requirements in a rapid thermal annealing (RTA) application. Preferably, greater than ten thermal shields 120 reside between the heat source 115 and the substrate 110. Furthermore, the thermal shields 120 may have a low HC, thereby generally permitting a rapid temperature response, as will be discussed hereafter.

The plurality of thermal shields 120 are generally separated from one another by a predetermined distance D, thereby defining one or more gaps 165 between the plurality of thermal shields 120. The predetermined distance D defining the one or more gaps 165 between the plurality of thermal shields 165 is furthermore associated with a mean free path of a conductive gas (not shown) residing therein. For example, the predetermined distance D is less than or about equal to the mean free path of the gas (not shown). The conductive gas (not shown) residing within the one or more gaps 165, is preferably selected from a set of gases (e.g., hydrogen, nitrogen, argon, or helium) that generally are inert with respect to the plurality of thermal shields 165, thus not changing an emissivity associated with the plurality of thermal shields. Furthermore, it is preferable that a volume of the container 105 should be sized such that a volume of the conductive gas (not shown) within the container 105 is as small as possible, in order to allow for a rapid switching of gas, as discussed infra. The conductive gas (not shown), for example, flows freely between the thermal shields 120 and the inner portion 145 of the container 105 such that the container volume is generally at the same pressure at any time.

According to one exemplary aspect of the invention, the predetermined distance D separating the plurality of thermal shields 120 is determined by a surface roughness of the plurality of thermal shields. For example, a surface roughness of between one and five microns yields a predetermined distance D which is generally less than or about equal to the mean free path of the conductive gas (not shown) residing within the one or more gaps 165. Alternatively, one or more spacers (not shown) can be distributed between the plurality of thermal shields 120, wherein the predetermined distance D separating the plurality of thermal shields is generally determined by the one or more spacers.

According to yet another exemplary aspect of the invention, a control of pressure of the conductive gas (not shown) within the one or more gaps 165 provides an efficient thermal switching of thermal conductivity between a generally conductive and a generally non-conductive state. For example, by changing the pressure from about 1 Torr to about 100 Torr, a heat transfer coefficient (HTC) can be controlled from a value less than about 2 mW/cm$^2$C to a value greater than about 400 mW/cm$^2$C. In addition, by the predetermined distance D establishing the one or more gaps 165 (e.g., less than a few microns), wherein a volume of gas within the one or more gaps is small, gas conduction is generally substantially in the free molecular regime, wherein thermal conduction is substantially independent of the one or more gaps and depends primarily on pressure. Furthermore, such gas conduction in the free molecular regime can be made substantially uniform across the plurality of thermal shields 120. The small gas volume, for example, can provide for a fast response time (e.g., on the order of about 10 mS), thereby allowing a heating of the substrate to be activated or deactivated expeditiously.

Generally, the behavior of the conducting gas heat transfer coefficient (HTC) across the predetermined distance D falls into three operating regimes; namely, the viscous regime, the molecular regime, and the transition regime. In the viscous regime, the HTC is a function of the predetermined distance D and the thermal conductivity of the conducting gas, but is generally independent of the pressure of the conducting gas in the one or more gaps 165 (hereafter referred to as gap pressure). In the free molecular regime, the HTC is a function of the gap pressure and the molecular weight of the conducting gas, but is independent of the predetermined distance D. Furthermore, the transition regime is characterized by a smooth interpolation between the viscous regime and the molecular regime. Conduction of heat through a gas in the molecular regime, as defined by the present invention, can be more quickly controllable, and be more efficient over the viscous regime.

If the composition of the thermally conducting gas does not vary, for example, if only nitrogen is used as the conducting gas, then the thermal conductivity and molecular weight of the conducting gas are generally constant. In this situation, the behavior of the HTC can be summarized as follows: in the viscous regime, the predetermined distance D controls the HTC; in the molecular regime, the gap pressure controls the HTC; and in the transition regime, both the predetermined distance D and the gap pressure control the HTC.

Conduction of heat through a gas in the free molecular regime, as defined by the present invention, provides for several unique advantages. For example, by maintaining the one or more gaps 165 (e.g., as defined by the predetermined distance D) on the order of the mean free path of the conductive gas, heating across the substrate 110 is substantially insensitive to the predetermined distance D and instead is primarily a function of the conductive gas pressure, thereby leading to spatial heating uniformity across the substrate. In addition, since the predetermined distance D is small, the volume associated therewith is also small, thereby allowing a heating of the substrate 110 to be quickly effectuated by simply altering the conductive gas pressure. Thus, the present invention allows one to quickly halt the heating of the substrate 110 once a spike anneal temperature is reached by altering the pressure.

Figure 5:
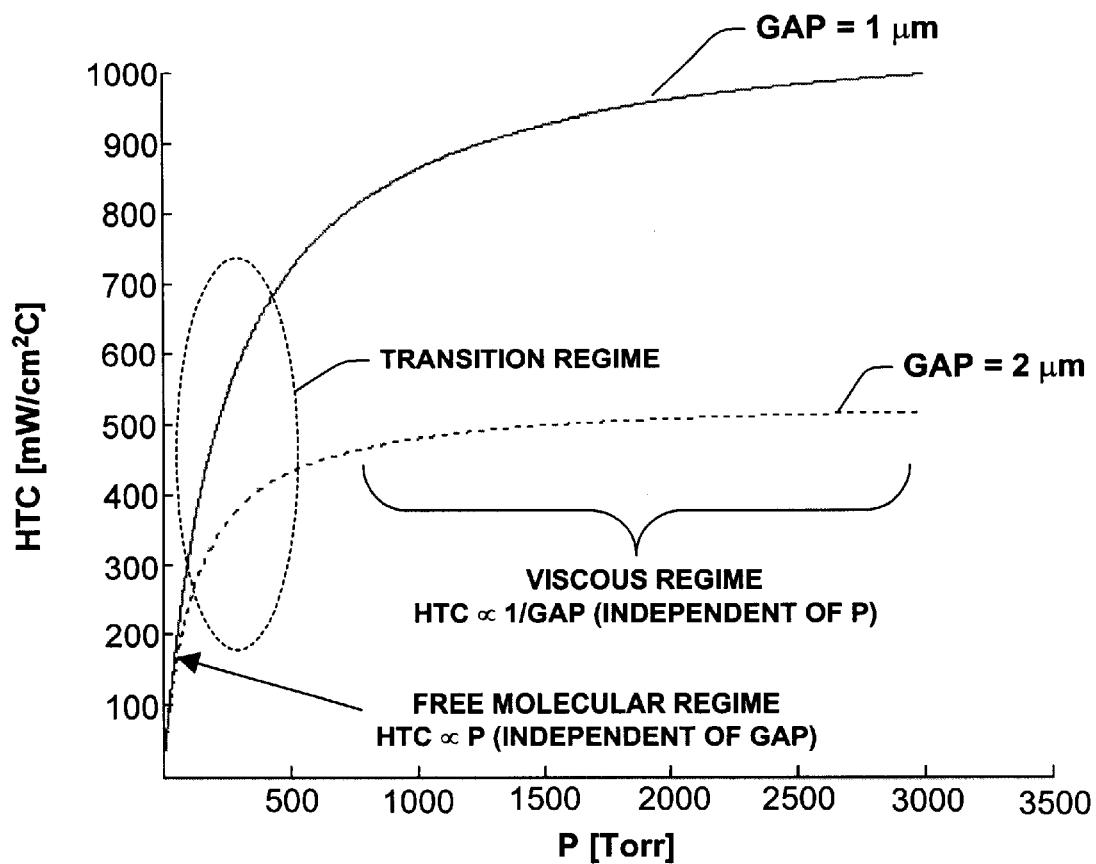
FIG. 5 is a chart illustrating heat transfer coefficient versus pressure according to still another exemplary aspect of the present invention.

FIG. 5 is a graph that illustrates the behavior of the HTC versus gap pressure for nitrogen at predetermined distances D of 1 and 2 microns. The molecular regime, in which the HTC is primarily a function of gap pressure, is seen for gas pressures in the range of about 0 to 250 Torr when the predetermined distance D is 1 micron, or when the predetermined distance D is less than the mean free path (MFP) of the conducting gas. The viscous regime, in which the HTC is primarily a function of the predetermined distance D, is seen for gap pressures greater than approximately 550 Torr when the predetermined distance D is 1 micron, or when the predetermined distance D is greater than the mean free path (MFP) of the conducting gas. Between these two regimes, the transition regime is seen.

FIG. 5 further illustrates that the conducting gas HTC can be controlled by adjusting the gap pressure, however, the predetermined distance D still plays a role in the HTC at higher pressures. For example, for a predetermined distance D of 2 microns as compared to the 1 micron example discussed above, the thermal conductivity of the conducting gas begins transitioning from the molecular regime to the viscous regime at approximately 250–275 Torr. Therefore, uniformity of the predetermined distance D is still a concern when varying pressures from atmospheric pressure to substantial vacuum pressures (e.g., less than 20 Torr). However, by controlling the conductive gas pressure between substantial vacuum and about 250 Torr, the HTC can be controlled primarily by the conductive gas pressure, independent of slight variations in the predetermined distance D of the one or more gaps 165. Therefore, heating uniformity across the substrate 110 is provided.

Accordingly, the pressure controlled thermal device 100 of FIG. 2 can be utilized to rapidly switch between directing a large amount and a small amount of thermal energy toward the substrate 110. For example, a low HTC associated with a low heat flux directed toward the substrate 110 can be attained by applying a high vacuum at a first pressure $P_1$ (e.g., less than 20 Torr) to the container 105, wherein the conductive gas between the plurality of shields generally limits thermal conduction between the plurality of shields 120 at the first pressure $P_1$, and wherein a temperature at the surface 155 of the container 105 is significantly less than a temperature at the surface 135 of the heat source 115. Therefore, at the first pressure $P_1$, thermal conduction from the heat source 115 to the substrate 110 occurs primarily through radiation.

Likewise, a large HTC associated with a high heat flux directed toward the substrate 110 can be attained by applying a slight vacuum at a second pressure $P_2$ (e.g., approximately 100–200 Torr) to the container 105, wherein the conductive gas is permitted to flow in the one or more gaps 165 between the plurality of thermal shields 120 at the second pressure $P_2$. At the second pressure $P_2$, the conductive gas is generally thermally conductive, wherein thermal energy from the heat source 115 is conducted through the plurality of shields 120, and wherein the temperature at the surface 155 of the container 105 approximates the temperature at the surface 135 of the heat source 115.

At a low value of gas pressure within the one or more gaps 165 (e.g., a first pressure $P_1$ of under 20 Torr), wherein the heat transfer from the surface 135 of the heat source 115 to the surface 155 of the container 105 is dominated by adiation, a large number of low emissivity thermal shields 120, for example, will yield a relatively low HTC. Consequently, a large temperature difference between the heat source 115 and the surface 155 of the container 105 can be seen at low pressures within the one or more gaps 165. Increasing the conductive gas pressure superimposes a conductive component onto the radiation, wherein, for example, the HTC can increase by three orders of magnitude or more, thereby allowing a large heat flux and small temperature difference between the heat source 115 and the surface 155 of the container 105. As an example, ten thermal shields 120 are situated between the surface 155 of the heat source 115 at 1500C and the surface 155 of the container 105, wherein each of the ten thermal shields 120 has an emissivity of about 0.2. The resulting temperature at the surface 155 of the container 105 is calculated to be approximately 500C at the first pressure P1, while the temperature at the surface of the container is slightly less than 1500C at the second pressure $P_2$. Therefore, a significant change in HTC, and thus a temperature of the substrate 110, can be obtained simply by changing the gap pressure (e.g., within the range of approximately 0 to 300 Torr).

Figure 6:
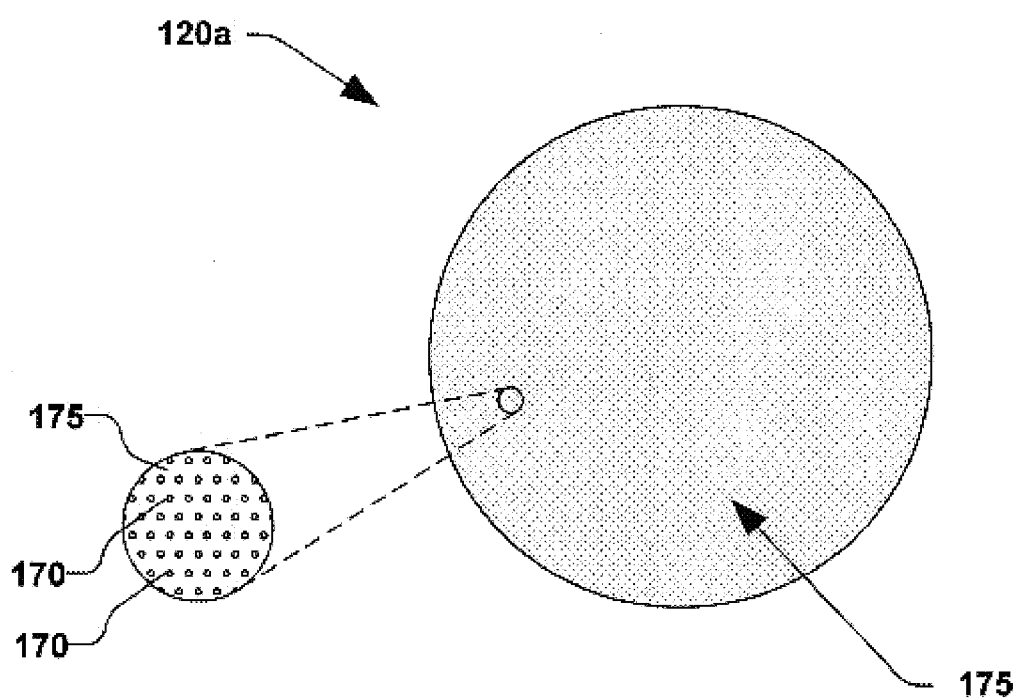
FIG. 6 is a plan view of an exemplary thermal shield comprising a plurality of holes according to another exemplary aspect of the present invention.

According to still another exemplary aspect of the present invention, one or more of the plurality of thermal shields 120 are perforated, wherein the conductive gas residing within the one or more gaps 165 is generally permitted to quickly approach a uniform pressure. FIG. 6 illustrates an exemplary thermal shield 120a comprising one or more perforations 170 across a surface 175 of the thermal shield. The one or more perforations 170 are small, as compared to a total surface area of the thermal shield 120a, wherein the one or more perforations do not significantly interfere with the free molecular regime conduction of thermal energy within the one or more gaps (not shown). Although the one or more perforations 170 are illustrated as being of uniform shape and arranged in an ordered manner, other arrangements of the one or more perforations are also contemplated, and any shape or order of perforations or other such alternatives are contemplated as falling within the scope of the present invention.

The perforations 170 are small, however, they are large enough in one example to permit gas flow therethrough in the viscous regime. Gas flow in the viscous regime is about 50 times greater than gas flow in the free molecular regime for a given pressure. By properly sizing the perforations 170, gas flow in the viscous regime permits cooling gas to quickly flow therethrough that facilitates fast thermal switching.

According to another exemplary aspect of the invention, the plurality of thermal shields 120 of FIG. 2 are vertically aligned such that the perforations (e.g., as illustrated in FIG. 6) are substantially staggered from one another from one thermal shield to another. Staggering the perforations (not shown) across the plurality of thermal shields 120 generally equalizes thermal non-uniformities generally caused by the perforations (not shown), wherein the thermal conduction through the conductive gas in the free molecular regime is not significantly impeded by the perforations.

In addition to the rapid thermal switching provided by the plurality of thermal shields 120, heat conduction from the surface 155 of the container 105 to the substrate 110 can be enhanced by using gas conduction. Gas conduction aids in reducing sensitivity of the thermal device 100 to variations in emissivity effects caused by device structures (not shown) on a surface 180 of the substrate 110. For example, the transfer of thermal energy 122 between the surface 155 of the container 105 and the substrate 110 is generally permitted via a process gas (not shown) residing therebetween. Wherein the sealing plate 140 provides no appreciable external deflection at the surface 155 of the container 105 when conductive gas pressure is changed, a radiation view factor of 1 is generally provided by the surface of the container in one example. The radiation view factor of 1 generally permits uniform radiative heating, except for emissivity effects caused by wafer device patterns. In order to have significant gas conduction between the surface 155 of the container 105 and the substrate 110, however, a small gap 185 is needed between the surface of the container and the substrate (e.g., between about 0.1 mm and 2 cm). A close proximity of the surface 155 of the container 105 to the substrate 110 advantageously permits convection and/or conduction through the process gas (not shown) at an appreciable level. The addition of the conduction and/or convection modes furthermore increase the rate of temperature change observed at the substrate 110.

The present invention advantageously provides a fast switching of free molecular regime gas conduction between the plurality of thermal shields 120. In addition, by establishing gas conduction in the free molecular regime, heating of the substrate 110 is dictated primarily by pressure, thereby enabling fast and uniform ramp rates for spike annealing. According to another exemplary aspect of the present invention, the thermal device 100 of FIG. 2 further comprises a vacuum source 190 and a gas source 195. The vacuum source 190, for example, is operable to generally evacuate the conductive gas (not shown) from the container 105 (and hence, from the one or more gaps 165 between the plurality of thermal shields 120) to a first pressure $P_1$ (e.g., less than 1 Torr). The gas source 195 is operable to supply the conductive gas (not shown) to the container 105 (and hence, to the one or more gaps 165 between the plurality of thermal shields 120) at the second pressure $P_2$ (e.g., over pressures ranging from atmospheric pressure to less than 1 Torr). The conductive gas (not shown) is generally inert with respect to the container 105, heat source 115, and plurality of thermal shields 120. A volume of the container 105 occupied by the conductive gas, for example, is preferably kept low, and low volume supply lines 197 and automatic valves 198 are utilized to provide the rapid switching of the conductive gas between the first pressure and the second pressure.

According to yet another exemplary aspect of the present invention, the thermal device 100 can further be utilized to cool the substrate 110 (or anything requiring cooling), wherein the heat source 115 is maintained at a lower temperature than the substrate (or whatever is being cooled). Furthermore, during idle times, when energy conservation is important, the conductive gas pressure within the container 105, for example, can be maintained at a low pressure to minimize energy consumption.

Figure 3:
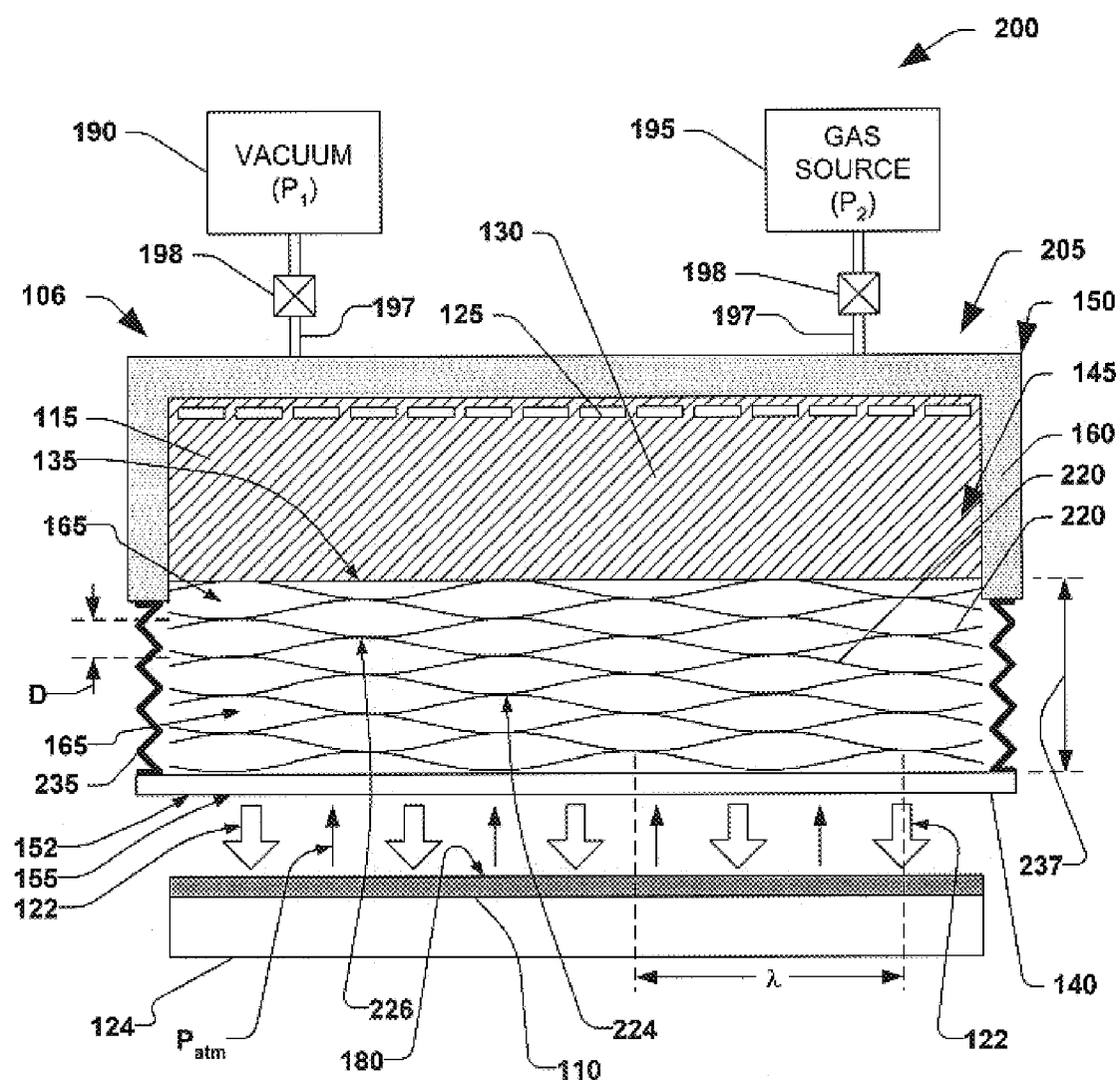
FIG. 3 is a cross-sectional view illustrating an exemplary thermal processing system in a generally thermally conductive state in the viscous regime according to another exemplary aspect of the present invention.

In accordance with still another exemplary aspect of the present invention, FIG. 3 illustrates another exemplary thermal device 200, wherein the predetermined distance D between a plurality of thermal shields 220 within a container 205 is selectively variable. For example, the plurality of thermal shields 220 are operable to selectively move with respect to one another in a direction generally perpendicular to the surface 155 of the container 205, thereby selectively varying the predetermined distance D. A bellows 235, for example, is situated between the sealing plate 140 and the heat source 130, wherein the bellows is operable to generally permit a selective variation in a distance 237 between the heat source and the surface 152 of the sealing plate. The bellows, for example, further generally isolates the inner portion 145 of the container 205 from the external environment 150. In accordance with another example, the sealing plate 140 comprises a flexible membrane (not shown), wherein the sealing plate is generally flexible.

According to another example, the plurality of thermal shields 220 are generally corrugated, wherein each of the plurality of thermal shields comprises a plurality of apexes 224, therein defining a wavelength $\lambda$ therebetween. The wavelength $\lambda$ is furthermore associated with a spring constant k associated with the plurality of thermal shields 220. The plurality of thermal shields 220, for example, are corrugated in a generally sinusoidal form, wherein the wavelength $\lambda$ of each thermal shield is generally less than a width (not shown) of the thermal shield. The wavelength $\lambda$ of each thermal shield, for example, is approximately 2.5 cm. The plurality of thermal shields 220, for example, are further angularly offset (e.g., approximately 90 degrees) from one another when viewed from the surface 155, wherein two or more of the plurality of thermal shields are operable to primarily contact one another only at the plurality of apexes 224 associated therewith, therein defining a plurality of contact points 226 associated with the two or more thermal shields. The one or more gaps 165 (and hence, the predetermined distance D) are therefore further generally defined between the plurality of contact points 226. Providing contact points 226 associated with the plurality of thermal shields 220, for example, generally limits an amount of thermal conduction through the plurality of thermal shields. The contact points 226 can further be generally evenly distributed across the plurality of thermal shields 220, wherein any thermal conduction through the contact points is distributed substantially evenly.

A composition of the plurality of thermal shields 220, for example, is selected such that the plurality of thermal shields provide a substantial resiliency upon a variation in the predetermined distance D. Furthermore, the composition of the plurality of thermal shields 220 is selected such that the resiliency is generally maintained at high temperatures, such as at process temperatures of approximately 1500C. For example, a variation in the predetermined distance D of approximately 100 microns at process temperatures of approximately 1500C should not significantly impact the resiliency of the plurality of thermal shields 220. Preferably, the plurality of thermal shields 220, for example, are comprised of a material such as molybdenum, wherein the material further provides good tensile strength characteristics (e.g., a factor associated with the spring constant k) at the high process temperatures (e.g., around 1500C).

As discussed previously, the thermal conduction through the gas (not shown) within the one or more gaps 165 is generally in the viscous regime when the pressure of the gas is generally around atmospheric pressure (e.g., 760 torr) or higher. Accordingly, the thermal conduction through the gas (not shown) from the heat source 130 to the substrate 110 is generally dependent on the predetermined distance D in the viscous regime, and is furthermore generally independent of pressure in the viscous regime, as described above and illustrated in the graph of FIG. 5. The plurality of thermal shields 220 of FIG. 3, however, unlike the plurality of thermal shields 120 of FIG. 2, are generally moveable with respect to one another, thereby generally permitting a variation in the predetermined distance D between the plurality of thermal shields 220 of FIG. 3. Such a variation in the predetermined distance D is consequently operable to vary the thermal conduction through the gas at pressures generally above 400 torr.

Figure 4:
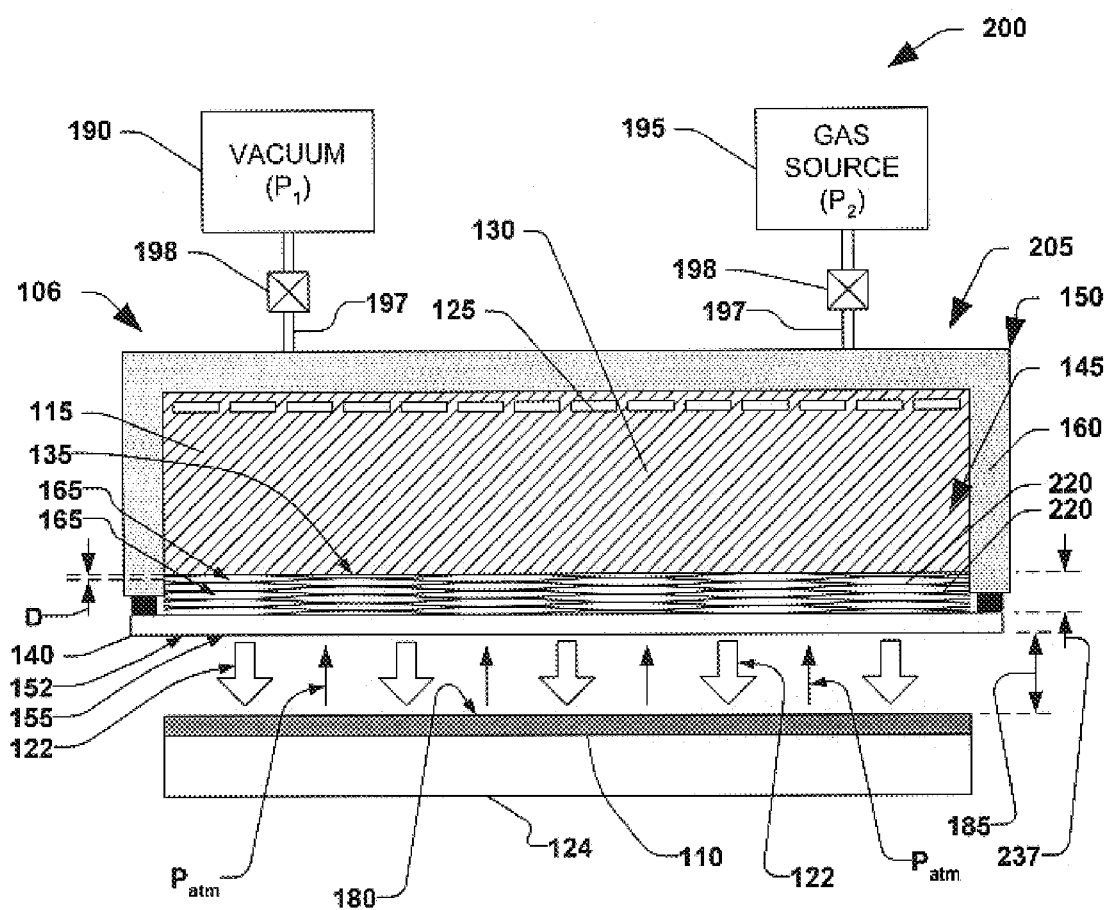
FIG. 4 is a cross-sectional view illustrating the thermal processing system of FIG. 3 in a generally non-thermally conductive state according to yet another exemplary aspect of the present invention.

Again referring to FIG. 3, the device 200 comprises the gas source 195 and the vacuum source 190 associated with the container 205, wherein the gas source and the vacuum source are operable to selectively flow the gas (not shown) within the one or more gaps 165 at the first pressure $P_1$ and the second pressure $P_2$. According to another exemplary aspect of the present invention, the plurality of thermal shields 220 of the device 200 are operable to compress and expand with respect to one another, wherein the compression and expansion of the plurality of thermal shields 220, for example, is based, at least in part, on a pressure differential between the pressure within the container 205 (e.g., the first pressure $P_1$ and the second pressure $P_2$) and a third pressure $P_3$ (e.g., atmospheric pressure) associated with the external environment 150. For example, the first pressure $P_1$ is slightly less than the third pressure $P_3$, wherein the pressure differential between the first pressure $P_1$ and the third pressure $P_3$ is operable to generally compress the plurality of thermal shields 220 with respect to one another, thereby decreasing the predetermined distance D, as illustrated in FIG. 4. Likewise, the second pressure $P_2$, for example, is slightly greater than the third pressure $P_3$, wherein the pressure differential between the second pressure $P_2$ and the third pressure $P_3$ is operable to generally expand the plurality of thermal shields 220 with respect to one another, thereby increasing the predetermined distance D, as illustrated in FIG. 3.

The first pressure $P_1$ and the second pressure $P_2$, for example, are selected based, at least in part, on the spring constant k of the plurality of thermal shields 220, wherein the first pressure $P_1$ and the second pressure $P_2$ are operable to provide an adequate pressure differential with the third pressure $P_3$ in order to overcome the resiliency of the plurality of thermal shields. Furthermore, the first pressure $P_1$ and the second pressure $P_2$ are selected such that the predetermined distance D can be selectively varied by a significant amount (e.g., from approximately 1 micron to approximately 100 microns).

According to another exemplary aspect of the present invention, the gas (not shown) residing within the one or more gaps 165 is selectively varied between a respective low thermally conductive state and a high thermally conductive state by the variation of the predetermined distance D. For example, a substantially small predetermined distance D (e.g., a distance of approximately 1 micron), as illustrated in FIG. 4, generally provides poor thermal conduction through the gas (not shown) in the viscous regime, while a substantially large predetermined distance D (e.g., a distance of greater than 100 microns), as illustrated in FIG. 3, generally provides high thermal conduction through the gas in the viscous regime. Accordingly, at the first pressure $P_1$, wherein the third pressure $P_3$ generally forces the plurality of thermal shields to compress with respect to one another, the predetermined distance D is quite small, wherein the gas residing within the one or more gaps 165 generally limits thermal conduction at such a small predetermined distance. Therefore, thermal conduction from the heat source 135 to the substrate 110 is significantly limited at the first pressure $P_1$. Conversely, the plurality of thermal shields 220 are operable to generally expand with respect to one another at the second pressure $P_2$, wherein the pressure differential between the second pressure $P_2$ and the third pressure $P_3$, in conjunction with the resiliency of the plurality of thermal shields, generally increases the one or more gaps 165, thereby generally permitting thermal conduction from the heat source 135 to the substrate 110.

Providing the plurality of thermal shields 220 which are operable to selectively vary the predetermined distance D (and hence, the thermal conductivity of the gas residing within the one or more gaps 165) by varying the pressure in the inner portion 145 of the container 205 has an advantage in that, in the viscous regime, significantly higher pressures (e.g., around atmospheric pressure) can be utilized. Therefore, high vacuum seals and pressure vessels are generally not required for the device 200 of FIGS. 3 and 4.

The present invention is also directed toward a method for thermally processing a substrate. While exemplary methods are illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the methods may be implemented in association with the systems illustrated and described herein as well as in association with other systems not illustrated.

Spike Anneal

Figure 7:
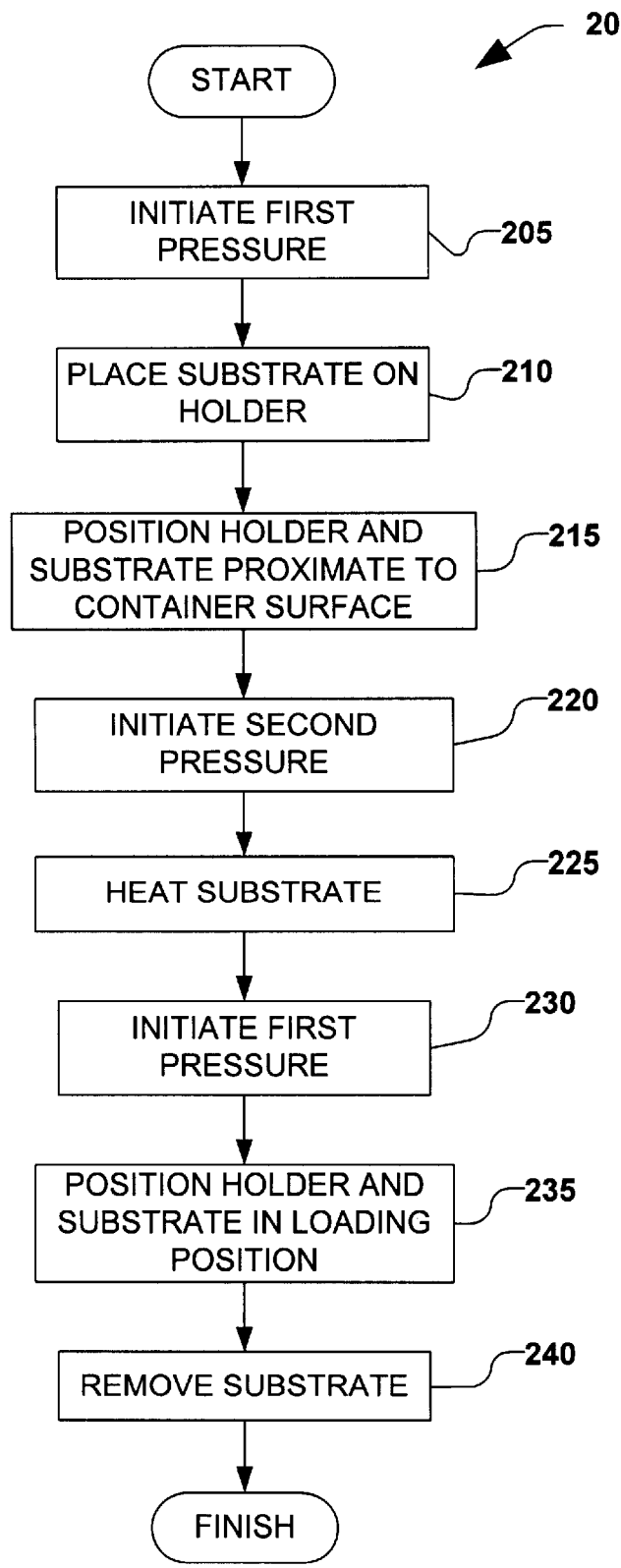
FIG. 7 is a flow chart diagram illustrating an exemplary methodology for thermally processing a substrate according to yet another aspect of the present invention.

FIG. 7 illustrates an exemplary method 200 for thermally processing a substrate in a thermal device. The method 200 begins with initiating a first pressure of a thermally conductive gas within a container comprising a heat source and plurality of thermal shields in act 205. The first pressure of the conductive gas, for example, corresponds to a low HTC and low heat flux within the container. The plurality of thermal shields are separated from one another by a predetermined distance, wherein the predetermined distance is associated with a mean free path of a conductive gas residing within one or more gaps defined by the predetermined distance. Alternatively, the predetermined distance is variable (e.g., between around 1 micron and around 100 microns). In act 210, the substrate is inserted into the thermal device. For example, the substrate is placed on a substrate holder (e.g., a plurality of pins) within the thermal device. The substrate is positioned proximate to a surface of the container in act 215. Alternatively, act 215 comprises positioning the container proximate to the substrate, however any insertion and location of the substrate proximate to the container is contemplated as falling within the scope of the present invention.

In act 220, a second pressure of the conductive gas is initiated, wherein the second pressure corresponds to a high HTC and high heat flux between the plurality of thermal shields within the container. The substrate is heated in act 225 by conduction and radiation from the heat source. For example, the substrate is heated until a maximum substrate processing temperature is reached. In act 230, the first pressure is again initiated, wherein heat transfer from the heat source to the substrate is substantially limited. The substrate is positioned in a loading position in act 235, and removed from the thermal device in act 240.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A thermal device for selectively heating a substrate, comprising:
    a container having a surface exposed to the substrate, the container further comprising:
        a heat source; and
        a plurality of thermal shields situated between the surface exposed to the substrate and the heat source, the thermal shields spaced from one another by a predetermined distance defining one or more gaps therebetween, wherein a gas generally resides within the one or more gaps, and wherein a control of pressure of the gas determines primarily an amount of thermal energy permitted to reach the substrate from the heat source.

2. The thermal device of claim 1, further comprising a gas source and a vacuum source operatively coupled to the container, wherein the gas source and the vacuum source are operable to selectively flow the gas within the one or more gaps at a first pressure and a second pressure.

3. The thermal device of claim 2, wherein the predetermined distance is generally fixed, and wherein the predetermined distance is less than or about equal to a mean free path of the gas.

4. The thermal device of claim 3, wherein the gas comprises a thermally conductive gas which is operable to generally prevent thermal conduction from the heat source through the plurality of thermal shields to the substrate at the first pressure, and wherein the gas is operable to generally permit thermal conduction from the heat source through the plurality of thermal shields to the substrate at the second pressure.

5. The thermal device of claim 3, wherein the vacuum source is operable to selectively evacuate the gas residing within the one or more gaps at the first pressure.

6. The thermal device of claim 3, wherein the first pressure ranges between about 0 Torr and 50 Torr.

7. The thermal device of claim 3, wherein the second pressure ranges between about 50 Torr and 700 Torr.

8. The thermal device of claim 3, further comprising a controller operable to control the first pressure and the second pressure via one or more of the vacuum source and the gas source.

9. The thermal device of claim 3, wherein the predetermined distance separating the plurality of thermal shields is determined by a surface roughness of the plurality of thermal shields.

10. The thermal device of claim 9, wherein the surface roughness of the plurality of thermal shields is between about 1 micron and 5 microns.

11. The thermal device of claim 3, further comprising one or more spacers distributed between the plurality of thermal shields, wherein the predetermined distance separating the plurality of thermal shields is determined by the one or more spacers.

12. The thermal device of claim 1, further comprising a sealing plate, wherein the sealing plate generally isolates an inner portion of the container from an external environment, wherein the inner portion comprises the heat source and the plurality of thermal shields, and wherein the surface of the container exposed to the substrate comprises a surface of the sealing plate.

13. The thermal device of claim 12, wherein the sealing plate is comprised of a low emissivity material.

14. The thermal device of claim 13, wherein the low emissivity material comprises one or more of $Si_3N_4$ or molybdenum.

15. The thermal device of claim 1, wherein the predetermined distance between each of the plurality of thermal shields is selectively variable.

16. The thermal device of claim 15, further comprising a sealing plate, wherein the sealing plate generally isolates an inner portion of the container from an external environment, wherein the inner portion comprises the heat source and the plurality of thermal shields, and wherein the surface of the container exposed to the substrate comprises a surface of the sealing plate.

17. The thermal device of claim 16, wherein the sealing plate is comprised of a low emissivity material.

18. The thermal device of claim 17, wherein the low emissivity material comprises one or more of $Si_3N_4$ or molybdenum.

19. The thermal device of claim 16, wherein the container further comprises a bellows is situated between the sealing plate and the heat source, wherein the bellows is operable to generally permit a selective variation in a distance between the heat source and the surface of the sealing plate.

20. The thermal device of claim 15, wherein the plurality of thermal shields are generally corrugated, wherein each of the plurality of thermal shields comprises a plurality of apexes, wherein a wavelength is defined therebetween, and wherein the wavelength is associated with a spring constant associated with the plurality of thermal shields.

21. The thermal device of claim 20, wherein the corrugation is generally sinusoidal in form.

22. The thermal device of claim 20, wherein the wavelength is approximately 2.5 cm.

23. The thermal device of claim 20, wherein the plurality of thermal shields are angularly offset from one another when viewed from the surface, wherein the two or more of the plurality of thermal shields are operable to primarily contact one another only at the plurality of apexes, therein defining a plurality of contact points associated with each of the plurality of thermal shields, and wherein the one or more gaps are further defined by a distance between the contact points.

24. The thermal device of claim 20, further comprising a gas source and a vacuum source operatively coupled to the container, wherein the gas source and the vacuum source are operable to selectively flow the gas within the one or more gaps at a first pressure and a second pressure, wherein the plurality of thermal shields are operable to generally decrease the predetermined distance at the first pressure, and wherein the plurality of thermal shields are operable to generally increase the predetermined distance at the second pressure.

25. The thermal device of claim 24, wherein the external environment is associated with a third pressure.

26. The thermal device of claim 25, wherein the first pressure is slightly less than the third pressure, and wherein the second pressure is slightly greater than the third pressure.

27. The thermal device of claim 25, wherein the first pressure is approximately 1–5 psi less than the third pressure, and wherein the second pressure is approximately 1–5 psi greater than the third pressure.

28. The thermal device of claim 25, wherein the third pressure is approximately atmospheric pressure.

29. The thermal device of claim 15, wherein each of the plurality of thermal shields has a thickness of approximately 55 microns.

30. The thermal device of claim 15, wherein the predetermined distance ranges between approximately 1 micron and 100 microns. distance ranges between approximately 1 micron and 100 microns.

31. The thermal device of claim 1, wherein the gas is comprised of one or more of helium, hydrogen, argon, or nitrogen.

32. The thermal device of claim 1, wherein the heat source comprises an electrical resistance heater.

33. The thermal device of claim 1, wherein the heat source is embedded with a high diffusivity material.

34. The thermal device of claim 33, wherein the high diffusivity material comprises an anisotropic material that generally directs heat toward the surface exposed to the substrate.

35. The thermal device of claim 33, wherein the high diffusivity material comprises one or more of tungsten, graphite or SiC.

36. The thermal device of claim 1, wherein the plurality of thermal shields are comprised of a low emissivity material.

37. The thermal device of claim 36, wherein the low emissivity material comprises one or more of $Si_3N_4$ or molybdenum.

38. The thermal device of claim 1, wherein the heat source has a heat capacity associated therewith, when the heat capacity generally permits a thermal switching time of approximately a few milliseconds.

39. The thermal device of claim 1, wherein the container further comprises one or more layers of insulation, wherein the one or more layers of insulation limits heat loss from the container.

40. The thermal device of claim 1, wherein each of the plurality of thermal shields comprises a plurality of perforations therethrough, wherein the gas is operable to flow through the plurality of perforations.

41. The thermal device of claim 40, wherein the plurality of perforations in one of the plurality of thermal shields are offset from the plurality of perforations in at least another one of the plurality of thermal shields.

42. A method of thermally processing a substrate, comprising:

providing a container having a surface exposed to the substrate, the container comprising a heat source and plurality of thermal shields situated between the heat source and the surface exposed to the substrate, wherein the plurality of thermal shields are spaced from one another by a predetermined distance defining one or more gaps therebetween; and controlling a pressure of a gas residing within the one or more gaps, wherein a heat transfer coefficient of the gas is primarily a function of pressure within the one or more gaps.

43. The method of claim 42, wherein the gas is controlled between a first pressure and a second pressure, wherein the gas generally limits the conduction of thermal energy from the heat source through the plurality of thermal shields at the first pressure, and wherein the gas generally conducts thermal energy from the heat source through the plurality of thermal shields at the second pressure.

44. The method of claim 43, wherein controlling the pressure of the gas comprises generally evacuating the gas from within the one or more gaps at the first pressure, and generally flowing the gas to the one or more gaps at the second pressure.

45. The method of claim 43, wherein the predetermined distance is generally fixed, wherein the predetermined distance is associated with a mean free path of the gas, and wherein the heat transfer coefficient of the gas is substantially independent of the predetermined distance.

46. The method of claim 45, wherein the first pressure is about 50 Torr or less, and the second pressure is about 100 Torr or more.

47. The method of claim 43, wherein the predetermined distance is variable, wherein the variation in the predetermined distance is generally a function of the gas pressure, and wherein the heat transfer coefficient of the gas is further a function of the predetermined distance.

48. The method of claim 47, wherein the first pressure is lower than a pressure at the substrate, and wherein the second pressure is higher than the pressure at the substrate.

49. The method of claim 48, wherein the pressure at the substrate is approximately atmospheric pressure.

50. The method of claim 42, further comprising maintaining the heat source at a generally constant temperature.

* * * * *

UNITED STATES PATENT AND TRADEMARK OFFICE
CERTIFICATE OF CORRECTION

PATENT NO. : 6,735,378 B1
DATED : May 11, 2004
INVENTOR(S) : Peter L. Kellerman and Frederick M. Carlson It is certified that error appears in the above-identified patent and that said Letters Patent is hereby corrected as shown below:

Column 15,
Line 37, please replace the number "55" with the number -- 50--.

Signed and Sealed this

Third Day of August, 2004

JON W. DUDAS
*Acting Director of the United States Patent and Trademark Office*